(12) United States Patent  (10) Patent No.: US 6,516,512 B1
Yamauchi  (45) Date of Patent: Feb. 11, 2003

(54) JIG FOR ATTACHMENT AND DETACHMENT OF ELECTRONIC COMPONENT

(75) Inventor: Katsutoshi Yamauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/533,873

(22) Filed: Mar. 24, 2000

(30) Foreign Application Priority Data

Jul. 19, 1999 (JP) .......................................... 11-204538

(51) Int. Cl.⁷ ................................................ B23P 19/00
(52) U.S. Cl. .............................. 29/764; 29/740; 29/759; 439/267; 439/372
(58) Field of Search .................. 29/739, 740, 758–760, 29/762, 764; 439/266, 267, 269.1, 345, 372

(56) References Cited

U.S. PATENT DOCUMENTS 4,981,440 A * 1/1991 Werner et al. ............... 439/266
5,425,169 A * 6/1995 Steinman et al. ............. 29/267
6,115,909 A * 9/2000 Miller .......................... 29/739
6,280,223 B1 * 8/2001 Lin ............................. 439/342

FOREIGN PATENT DOCUMENTS

JP  2-168585  6/1990

* cited by examiner

Primary Examiner—Timothy L. Maust
(74) Attorney, Agent, or Firm—Armstrong, Westerman & Hattori, LLP

(57) ABSTRACT

A jig for attachment and detachment comprises a frame. When the jig is set on the surface of a printed circuit board, a connector on the printed circuit board can be received in a connector receptacle opening defined at the lower end of the jig. The frame is designed to stand on the surface of the printed circuit board surrounding the connector. An electronic component can thereafter be inserted in an insertion opening defined at the upper end of the frame. The inserted electronic component is guided, by a guide passage defined in the frame, from the insertion opening toward the connector receptacle opening. The guided electronic component is received on the connector. The guide passage serves to allow the input/output pin of the electronic component to reliably enter the socket of the connector without any interference. An operator is released from careful observation for alignment of the electronic component with the connector with his own eyes.

11 Claims, 15 Drawing Sheets

JIG FOR ATTACHMENT AND DETACHMENT OF ELECTRONIC COMPONENT

BACKGROUND OF THE INVENTION

1. Field of the Invention

The present invention relates to a jig for attachment and detachment of an electronic component such as an MCM (multi-chip module) to and from a connector such as a so-called ZIF (zero insertion force) connector mounted on a printed circuit board.

2. Description of the Prior Art

When an electronic component such as an MCM is mounted on a printed circuit board, electric connection is established between a plurality of input/output pins protruding from the rear surface of the MCM and a plurality of corresponding input/output pads arranged on the upper surface of the printed circuit board. Such electric connection can be achieved by a ZIF connector mounted on the printed circuit board. The ZIF connector is supposed to allow attachment and detachment of the MCM to and from the printed circuit board without applying a damaging stress to the input/output pins of the MCM.

A ZIF connector usually comprises a pair of upper and lower substrates sequentially superposed on the surface of the printed circuit board. A plurality of sockets are formed in the ZIF connector so as to receive the input/output pin of the MCM. The respective sockets comprise an upper through hole penetrating through the upper substrate and a lower through hole penetrating through the lower substrate. When the upper substrate is slid relative to the lower substrate, the upper through holes are shifted to a position off the corresponding lower through holes. Such sliding movement of the upper substrate allows the input/output pins to be held between the inner surfaces of the upper and lower through holes. Since a larger contact friction can be maintained between the upper and lower substrates, the input/output pins can reliably be held between the inner surfaces of the upper and lower through holes.

When an MCM is to be coupled with a ZIF connector, the MCM must be properly positioned relative to the ZIF connector, so that the respective input/output pins of the MCM are aligned with the corresponding sockets of the ZIF connector. Such alignment allows the sockets to receive the corresponding input/output pins. If an operator is forced to manually mount the MCM on the ZIF connector, the operator must carefully observe the position of the MCM with his own eyes. It is impossible to completely avoid collision of the input/output pins against the entrances of the sockets at their tip ends. The input/output pins suffer from damages such as deformation.

In particular, maintenance of computer systems often requires attachment and detachment of an electronic component such as an MCM to and from a printed circuit board without disassembling the printed circuit board from the computer system. Without disassembly of the printed circuit board, it is possible to avoid a troublesome operation of disconnecting and connecting a large number of wires and cables from and to the printed circuit board. The maintenance can be simplified. However, it is more difficult to an operator to align the input/output pins of the MCM with the corresponding sockets of the ZIF connector during the maintenance, since the ZIF connector is surrounded by other printed circuit boards and electronic components, which tend to block the operator's field of view.

SUMMARY OF THE INVENTION

It is accordingly an object of the present invention to provide a jig for attachment and detachment of an electronic component, useful to simply and efficiently allow input/output pins of the electronic component to enter corresponding sockets or holes of a connector, thereby improving the operability.

According to the present invention, there is provided a jig for attachment and detachment of an electronic component, comprising: a frame; a connector receptacle opening defined in the frame so as to have dimensions enough to surround a connector mounted on a printed circuit board; an insertion opening defined in the frame so as to have dimensions enough to surround an electronic component with an input/output pin received in the connector; and a guide passage defined in the frame so as to extend from the insertion opening to the connector receptacle opening.

When an electronic component is to be set on a connector mounted on a printed circuit board, for example, the frame is set on the surface of the printed circuit board so as to surround the connector. The connector is received in the connector receptacle opening of the frame. The frame is designed to stand on the surface of the printed circuit board surrounding the connector. The electronic component is thereafter inserted into the insertion opening. The electronic component is then allowed to move along the guide passage toward the connector receptacle opening. The guide passage serves to allow the input/output pin of the electronic component to reliably enter the socket of the connector without any interference. An operator is released from careful observation for alignment of the electronic component with the connector with his own eyes.

Such a jig may be employed to attach an electronic component such as an MCM (multi-chip module) to a so-called ZIF (zero insertion force) connector. In this case, the jig may comprise a swinging lever supported on the frame so as to engage with a rotative cam for opening and closing a socket of the connector. In general, the upper substrate is driven to slide on the lower substrate electrically connected by soldering to the printed circuit board in a ZIF connector. Such sliding movement allows the socket to fully open. A rotative cam is usually employed to establish the driving force applied to the upper substrate. The rotative cam is designed to generate the driving force with a cam surface offset to the rotation axis of the rotative cam when the rotative cam is driven for rotation. The rotative cam should receive a torque enough to overcome the contact friction induced between the upper and lower substrates. Employment of the swinging lever serves to amplify a small torque, applied to the free end of the swinging lever, to a larger torque received by the rotative cam. The swinging lever is preferably kept in an attitude perpendicular to the rotation axis of the rotative cam.

When the swinging lever is employed in the above-described manner, the jig may further comprise: an operating lever supported on the frame for swinging movement around a support axis; and a link member connected to the operating lever at a first connecting axis for swinging movement and to the swinging lever at a second connecting axis for swinging movement. The operating lever and the line member are designed in combination to establish a link mechanism.

If the distance between the support axis and the first connecting axis is set larger than the distance between a center of swinging movement of the swinging lever and the second connecting axis in the link mechanism, the swinging movement of the operating lever can be amplified and transformed to the swinging movement of the swinging lever. A less extent of the swinging movement is only required for the operating lever so as to induce rotation of the rotative cam required to achieve opening and closing operation of the socket. Such an extent of the swinging movement serves to prevent the tip end of the operating lever from projecting outward of the frame. Even when other printed circuit board and/or electronic components are disposed to closely surround the connector, attachment and detachment of the electronic component can reliably be achieved without any interference in such a crowded circumstance.

The jig may further comprise a first restriction member located on the frame at a position to collide with the operating lever when the socket of the connector is closed, in addition to a second restriction member located on the frame at a position to collide with the operating lever when the socket of the connector is opened. The first and second restriction members are adapted to reliably restrict the extent of the movement of the operating lever. Accordingly, the rotative cam of the connector can be prevented from an excessive rotation beyond the extent required to fully open and close the socket of the connector. The connector can be prevented from damages due to any excessive rotation of the rotative cam.

The jig may further comprise a grip attached to the free or tip end of the operating lever. The grip is preferably designed to extend across the insertion opening when the socket is closed. Such a grip serves to avoid an erroneous insertion of an electronic component into the guide passage when the socket is closed. The electronic component can reliably be prevented from colliding against the closed socket. The input/output pin of the electronic component can thus be prevented from damaging.

Furthermore, the jig may further comprise a fixation mechanism adapted to fix the frame to the printed circuit board. Such a fixation mechanism may serve to release an operator from troublesome operation to keep urging the jig against the printed circuit board during an overall period of maintenance. The operation of maintenance can be simplified. In particular, such a fixation mechanism is most useful when the printed circuit board is kept upright in a vertical direction.

The fixation mechanism may comprise: a leaf spring attached to the frame so as to keep a free end thereof apart from the frame; a hook formed at the free end of the leaf spring so as to keep retracted out of the connector receptacle opening when no load is applied to the leaf spring; and a slider member guided along an outer periphery of the frame so as to apply an urging force to the leaf spring for bringing the hook into engagement with the connector in response to deformation of the leaf spring. Such a fixation mechanism is designed to allow the hook at the free end of the leaf spring to be released from engagement with the connector when no load is applied to the leaf spring, so that the jig can be removed from the connector or the printed circuit board. On the other hand, when the slider member moves to apply the urging force to the leaf spring, the leaf spring is deformed to establish engagement of the hook with the rear of the connector. The jig can be fixed to the connector in this way. Specifically, only a simple movement of the slider member along the outer periphery of the frame is required to establish and release engagement or fixation of the jig to the printed circuit board.

When the hook is released from engagement with the connector, it is preferable to terminate the operation of attachment or detachment of an electronic component. If such operation is maintained with the jig detached from the printed circuit board, the jig may be shifted or slid during the operation of attachment or detachment. The connector and/or the input/output pin of the electronic component are possibly damaged. According to the present invention, a stopper may be employed to prevent such incorrect operation. The stopper may be adapted to extend across a path of movement of the operating lever when the fixation mechanism fails to fix the frame to the printed circuit board or when the slider member fails to establish the urging force to the leaf spring.

In addition, when the socket is opened in the connector, it is preferable to avoid removal of the jig, since such removal causes the connector to suffer from damages and/or trouble in subsequent attachment of an electronic component. According to the present invention, a drop prevention member may be employed to prevent such undesirable removal. The drop prevention member may be located right on a path of movement of the slider member when the socket is opened.

Otherwise, the jig may further comprise a restriction member protruding into the guide passage, for example. Such restriction member may serve to always mount an electronic component of a proper attitude or aspect on the connector. The input/output pin can further reliably be prevented from damaging.

Furthermore, the jig may further comprise an observation window defined by an edge aligned with an upper edge of the electronic component when the electronic component has been completely set on the connector. Such an observation window may serve to prevent the socket to be opened and closed before the electronic component is completely mounted on the connector.

BRIEF DESCRIPTION OF THE DRAWINGS

The above and other objects, features and advantages of the present invention will become apparent from the following description of the preferred embodiment in conjunction with the accompanying drawings, wherein:

FIG. 9 is an enlarged sectional view schematically illustrating a leaf spring with no load applied to;

DESCRIPTION OF THE PREFERRED EMBODIMENT

Figure 1:
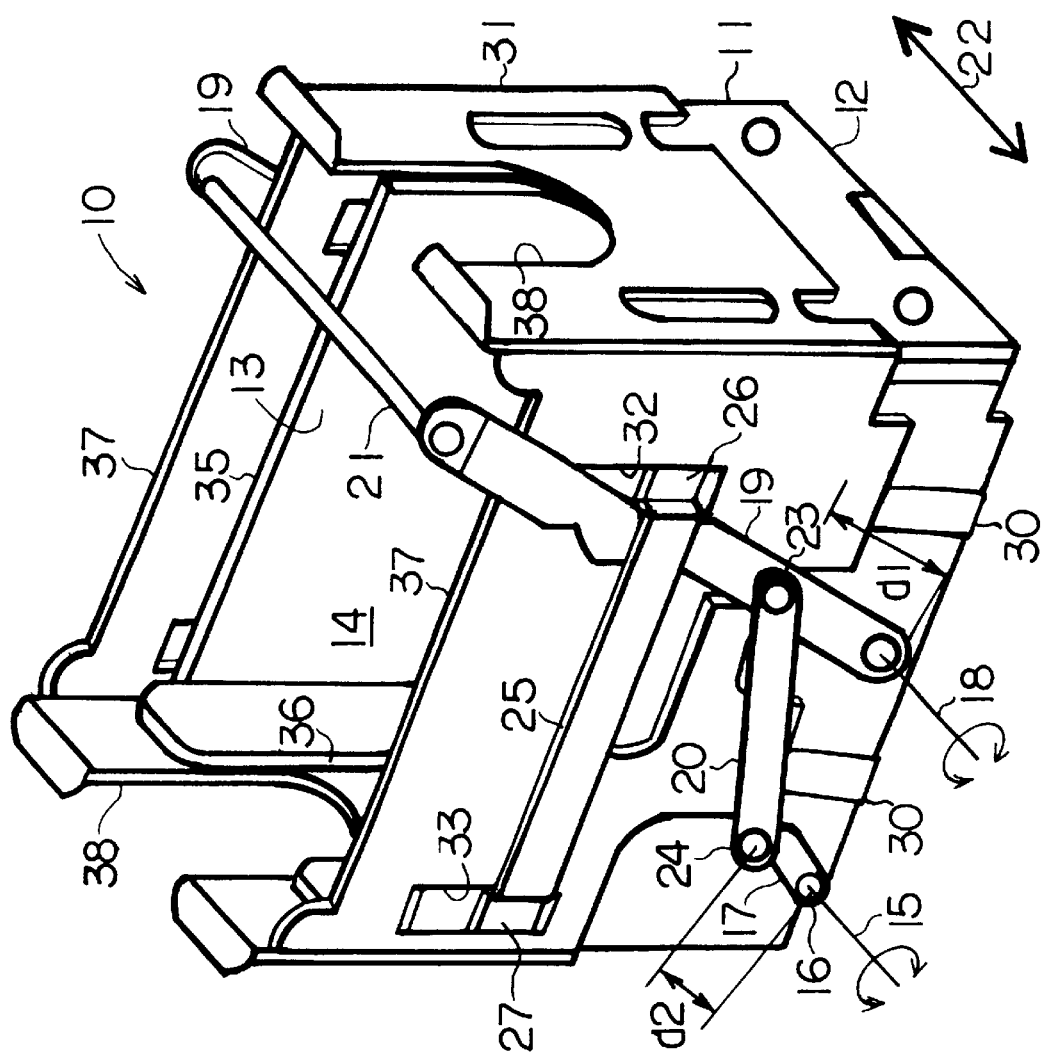
FIG. 1 is a perspective view schematically illustrating a jig for attachment and detachment according to the present invention.

FIG. 1 illustrates a jig 10 for attachment and detachment of an electronic component according to the present invention. The jig 10 comprises a rigid metallic frame 11 for defining the inner space of an rectangular parallelepiped, for example. The frame 11 at least surrounds continuous four rectangular planes of the inner space, as is apparent from FIG. 1. A connector receptacle opening 12 is defined in the frame 12 at the lower end. The connector receptacle opening 12 has dimensions enough to surround the outer periphery of a so-called ZIF (zero insertion force) connector, not shown. On the other hand, an insertion opening 13 is defined in the frame at the upper end. The insertion opening 13 has dimensions enough to surround the outer periphery of an electronic component, not shown. The electronic component may comprise input/output pins to be received in the ZIF connector.

A guide passage 14 is defined in the frame 11 so as to extend from the insertion opening 13 to the connector receptacle opening 12. The guide passage 14 may correspond to the inner space surrounded by the continuous four rectangular planes. Four parallel straight ridges of the inner space serve to connect four corners of the insertion opening 13 to corresponding four corners of the connector receptacle opening 12.

A pair of rotative pieces or axles 16 are supported on the frame 11 for rotation around a common central axis 15, which penetrates through the guide passage 14. Swinging levers 17 are integrally formed on the respective rotative axles 16. The respective swinging levers 17 are designed to synchronously swing about the common central axis 15.

A pair of operating levers 19 are supported on the frame 11 for swinging movement about a common support axis 18, which penetrates through the guide passage 14 in parallel with the central axis 15. The operating levers 19 are connected to the swinging levers 17 through link members 20, respectively. The combination of the swinging lever 17, the link member 20 and the operating lever 19 establishes a link mechanism, so that the swinging movement of the operating lever 19 can be linked to the swinging movement of the swinging lever 17. A grip 21 is attached to the tip ends of the operating levers 19 to connect the operating levers 19 to each other. The grip 21 may extend in parallel with the central axis 15. The link mechanism is established not only on the left side of the frame 11 in the lateral direction 22, as is apparent from FIG. 1, but also on the right side of the frame 11, not shown.

The link member 20 is connected at an end to the operating lever 19 through a first connecting axis or pin 23 for swinging movement. The other end of the link member 20 is connected to the leading end of the swinging lever 17 through a second connecting axis or pin 24 for swinging movement. The distance d1 between the support axis 18 and the first connecting pin 23 is set larger than the distance d2 measured between the central axis 15 and the second connecting pin 24.

In addition, an elongated stopper plate 25 is attached to the frame 11 for defining the extent over which the operating lever 19 is allowed for swinging movement. The stopper plate 25 comprises a first restriction member or piece 26 fixed to the frame 11 at a location to contact the operating lever 19 of a first predetermined attitude, and a second restriction member or piece 27 fixed to the frame 11 at a location to contact the operating lever 19 of a second predetermined attitude. The operating lever 19 is allowed to move within a space defined between the frame 11 and the stopper plate 25 in combination with the first and second restriction pieces 26, 27. In the case where a pair of the operating levers 19 are allowed to synchronously swing as described above, the stopper plate 25 may be provided not only on both left and right sides of the frame 11 but also on either of left and right sides of the frame 11. The stopper plate 25 can be punched out of a metallic thin plate, for example.

Four leaf springs 30 are attached to the frame 11 near the lower end. Only two leaf springs 30 are illustrated in FIG. 1. The leaf spring 30 is designed to warp outwardly in a direction to bring the lower end thereof apart from the frame 11 when no load is applied to the leaf spring 30. In addition, a rigid metallic slider member 31 is guided along the outer periphery of the frame 11. The slider member 31 is designed to move in a vertical direction along the outer periphery of the frame 11 so as to apply urging forces to the respective leaf springs 30. Window openings 32, 33 are formed in the slider member 31. The stopper plate 25 fixed at the frame 11 as described above is designed to pass through the window openings 32, 33. Specifically, the first and second restriction pieces 26, 27 of the stopper plate 25 are disposed in the window openings 32, 33, respectively. The window openings 32, 33 are designed to restrict the vertical movement of the slider member 31 along the frame 11. When the slider member 31 moves upward, the lower ends or edges of the window opening 32, 33 contact against the first and second restriction pieces 26, 27, so that the upper limit can be defined in the extent of the vertical movement of the slider member 31. On the other hand, when the slider member 31 moves downward, the upper ends or edges of the window openings 32, 33 contact against the first and second restriction pieces 26, 27, so that the lower limit can be established in the extent of the vertical movement of the slider member 31.

A pair of first recesses 35 are formed on the frame 11 at the upper ends of a pair of the opposed rectangular walls, respectively. Upper edges of the rectangular walls extend along a horizontal plane so as to define the first recesses 35. The first recesses 35 are adapted to function as observation windows for allowing an operator to observe an electronic component to be mounted on a ZIF connector as described later in detail.

A pair of second recesses 36 are formed on the frame 11 at the upper ends of a pair of the opposed rectangular walls, respectively, between the first recesses 35. Upper edges of the rectangular walls extend at a level lower than the aforementioned edges for the first recesses 35 so as to define the second recesses 36 reaching a lower level. Third and fourth recesses 37, 38 are also formed on the slider member 31 so as to correspond to the first and second recesses 35, 36, respectively.

Figure 2A:
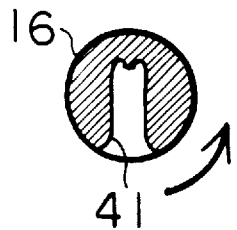
FIG. 2 is an enlarged view schematically illustrating the cross-section of a rotative axle.
Figure 2B:
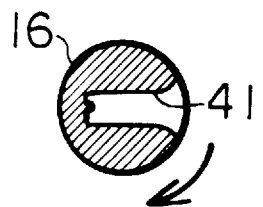
Figure 3:
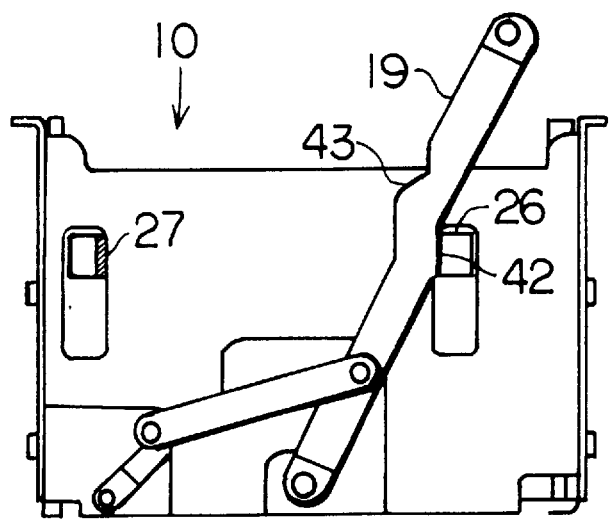
FIG. 3 is a side view of the frame illustrating the first attitude of an operating lever.
Figure 4:
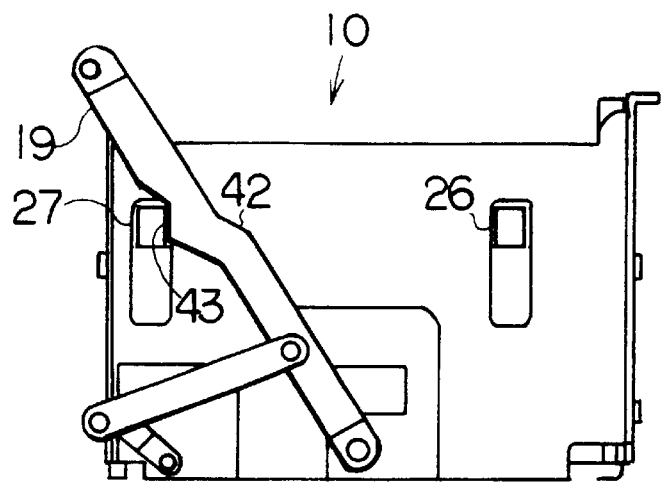
FIG. 4 is a side view of the frame illustrating the second attitude of the operating lever.

As is apparent from FIGS. 2A and 2B, cam receptacle grooves 41 are formed on the rotative axles 16, respectively, to extend in the longitudinal direction of the central axis 15. The cam receptacle groove 41 has a depth along the diametrical line at the circular section of the rotative axle 16. The cam receptacle grooves 41 are designed to rotate in response to rotation of the rotative axle 16 within an extent of approximately 90 degrees, as shown in FIGS. 2A and 2B. For example, when the operating levers 19 take the first attitude as shown in FIG. 3, the cam receptacle groove 41 takes a vertical attitude, as shown in FIG. 2A, so as to direct its opening or entrance downward. The stopper plate 25 receives the operating lever 19 at the first restriction piece 26 at this moment, as shown in FIG. 3. On the other hand, when the operating levers 19 take the second attitude as shown in FIG. 4, for example, the cam receptacle groove 41 changes its attitude to a horizontal attitude by rotation of approximately 90 degrees, as shown in FIG. 2B. The stopper plate 25 receives the operating lever 19 at the second restriction piece 27 in this situation, as shown in FIG. 4. Contact surfaces 42, 43 may be formed on the operating lever 19, as clearly shown in FIGS. 3 and 4, for example, so as to reliably receive the first or second restriction pieces 26, 27 over a larger area.

Figure 5:
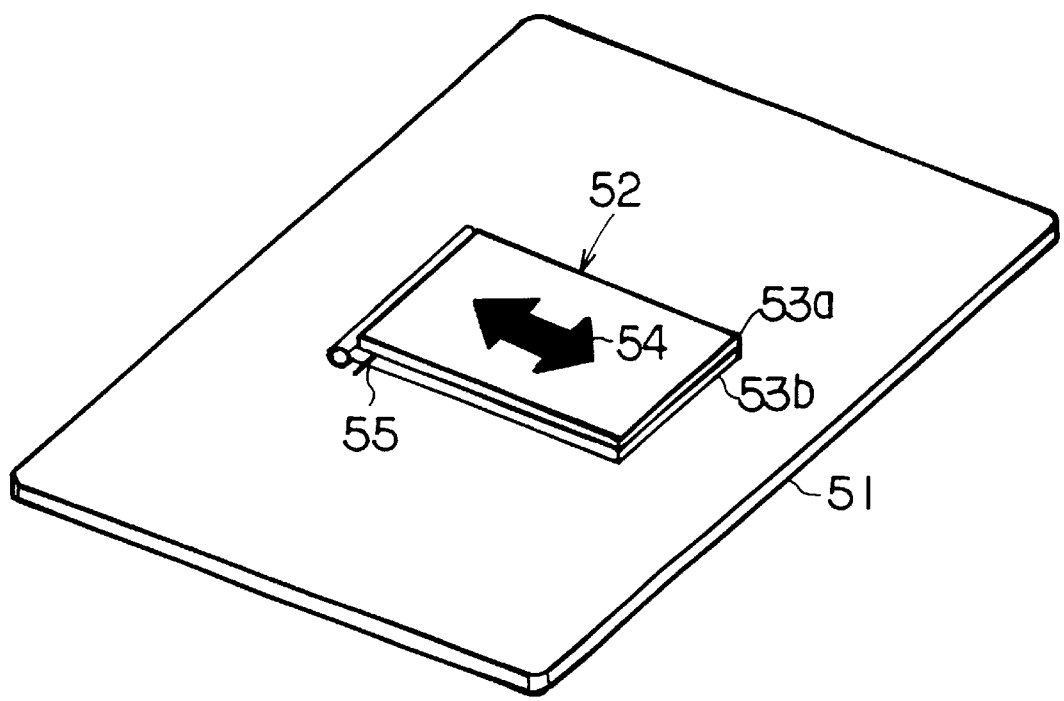
FIG. 5 is a perspective view schematically illustrating a ZIF (zero insertion force) connector mounted on a printed circuit board.

Assume that the aforementioned jig 10 is employed to assist attachment of an MCM (multi-chip module) to a printed circuit board. As shown in FIG. 5, a ZIF connector 52 has been mounted on the surface of the printed circuit board 51. The ZIF connector 52 is electrically connected to a printed wiring pattern on the printed circuit board 51. As is conventionally known, the ZIF connector 52 comprises upper and lower substrates 53a, 53b sequentially superposed on the surface of the printed circuit board 51. A plurality of upper through holes, not shown, are formed in the upper substrate 53a while corresponding lower through holes, not shown, are likewise formed in the lower substrate 53b. A combination of the upper and lower through holes provides a socket of the ZIF connector 52.

Conductive terminals of the respective lower through holes in the lower substrate 53b are fixedly connected to the printed wiring pattern on the printed circuit board 51. Soldering may be employed to fixation. As a result, the lower substrate 53b is made stationary to the printed circuit board 51. On the other hand, the upper substrate 53a is allowed to slide over the lower substrate 53b. Sliding movement of the upper substrate 53a is induced by a rotative cam 55 assembled within the lower substrate 53b, for example. The rotative cam 55 extends in a direction perpendicular to the direction 54 of the sliding movement so as to protrude its opposite ends out of the lower substrate 53b. As is conventionally known, the rotative cam 55 is designed to drive the upper substrate 53a with a cam surface, not shown, offset to the rotation axis of the cam 55 when the rotative cam 55 is driven for rotation.

Figure 6:
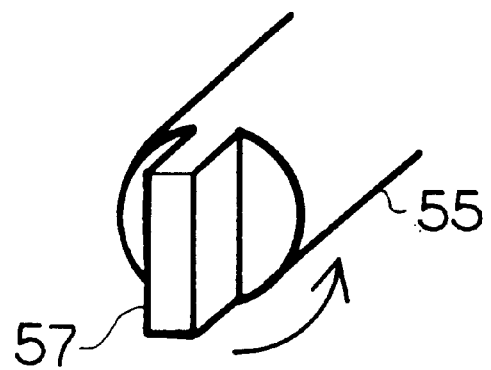
FIG. 6 is an enlarged perspective view illustrating the attitude of an engagement piece on a rotative cam when sockets are fully closed in the ZIF connector.
Figure 7:
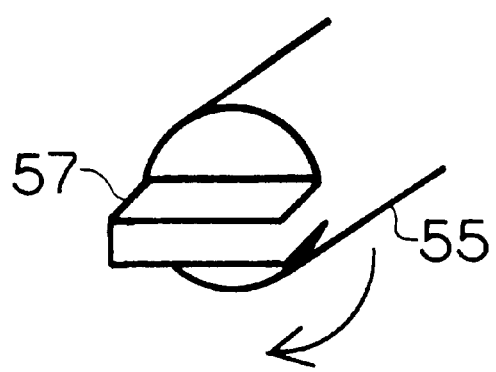
FIG. 7 is an enlarged perspective view illustrating the attitude of the engagement piece when the sockets are fully opened in the ZIF connector.

As shown in FIG. 6, engagement pieces 57 of a rectangular parallelepiped is integrally formed on the opposite end surfaces of the rotative cam 55 so as to protrude in the direction of the rotation axis of the rotative cam 55 in the ZIF connector 52. The engagement piece 57 extends along the diametrical line at the circular section of the rotative cam 55. When the rotative cam 55 is driven to establish a vertical attitude of the engagement piece 57 as shown in FIG. 6, the upper through holes of the upper substrate 53a are aligned with the corresponding lower through holes of the lower substrate 53b. The sockets are wide opened. The input/output pins of the MCM are capable of simply entering the opened sockets without any interference. On the contrary, the input/output pins can be released out of the opened sockets without any interference. On the other hand, when the rotative cam 55 is driven to establish a horizontal attitude of the engagement piece 57 as shown in FIG. 7, the upper substrate 53a is allowed to slide on the lower substrate 53b. The upper through holes of the upper substrate 53a reach positions off the corresponding lower through holes of the substrate 53b. As a result, the inner surface of the upper through hole serves to urge the input/output pin within the socket against the inner surface of the lower through hole. The input/output pins can be held between the inner surfaces of the upper and lower through holes tightly since a larger contact friction can be maintained between the upper and lower substrates 53a, 53b.

Figure 8:
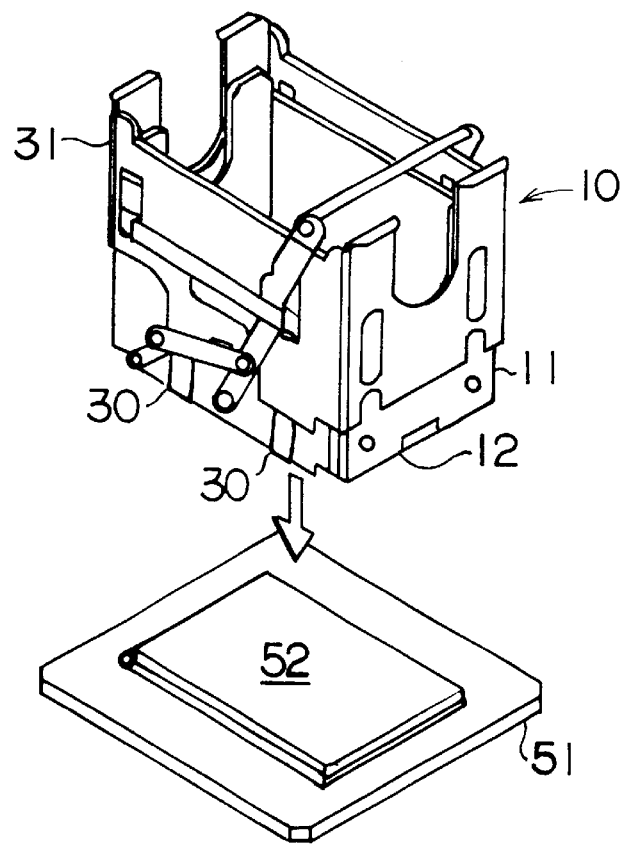
FIG. 8 is a perspective view illustrating the process of setting the jig on the printed circuit board when an MCM is to be mounted on the ZIF connector.

When the MCM is to be mounted on the ZIF connector 52, an operator is expected to set the jig 10 on the upper surface of the printed circuit board 51, as shown in FIG. 8. The ZIF connector 52 is received into the connector receptacle opening 12. When the jig 10 has been set in this manner, the frame 11 is allowed to stand upright on the surface of the printed circuit board 51 surrounding the ZIF connector 52.

Figure 9:
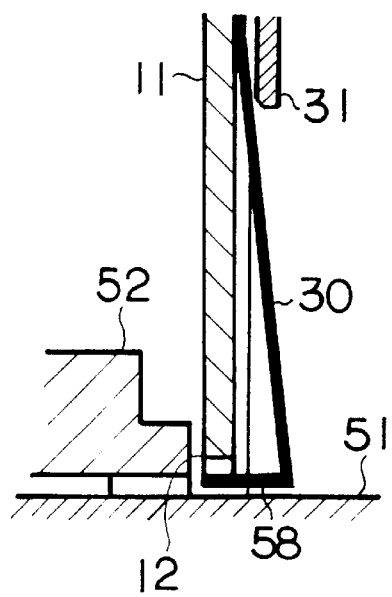

During setting of the jig 10 on the printed circuit board 51, the slider member 31 is maintained at the upper limit position in the jig 10. No urging forces are applied to the respective leaf springs 30 from the slider member 31. As shown in FIG. 9, the respective leaf springs 30 are allowed to warp outward so as to bring the free ends apart from the frame 11. The hooks 58 formed at the free ends of the leaf springs 30 are allowed to retract out of the connector receptacle opening 12. Specifically, the hooks 58 are released from the guide passage 14 in the jig 10. Accordingly, the ZIF connector 52 can be received in the connector receptacle opening 12 without any interference of the hooks 58.

At the same time, the operating lever 19 is kept in the first attitude. The cam receptacle grooves 41 of the rotative axle 16 are thus forced to take a vertical attitude as shown in FIG. 2A. On the other hand, the sockets are correspondingly kept closed in the ZIF connector 52, so that the engagement pieces 57 of the rotative cam 55 are also kept in a vertical attitude as shown in FIG. 6. When the jig 10 has been set on the printed circuit board 51 in this situation, the engagement pieces 57 are received in the cam receptacle grooves 41, respectively. The rotative axles 15, namely, the swinging levers 17 are engaged with the rotative cam 55.

As is apparent from the above description, the position of the rotative axles 16 in the frame 11 is determined to reflect the position of the rotative cam 55 in the ZIF connector 52. The rotative axles 16 positioned in this way serve to achieve engagement of the cam receptacle grooves 41 with the engagement pieces 57, in other words, engagement of the swinging levers 17 to the rotative cam 55. The jig 10 is simply mounted on the printed circuit board 51 only while the frame 11 is guided around the outer periphery of the ZIF connector 52. An operator is thus allowed to easily engage the tip ends of the swinging levers 17 with the engagement pieces 57 formed on the rotative cam 55 having the diameter of approximately 1–2 mm.

Figure 10:
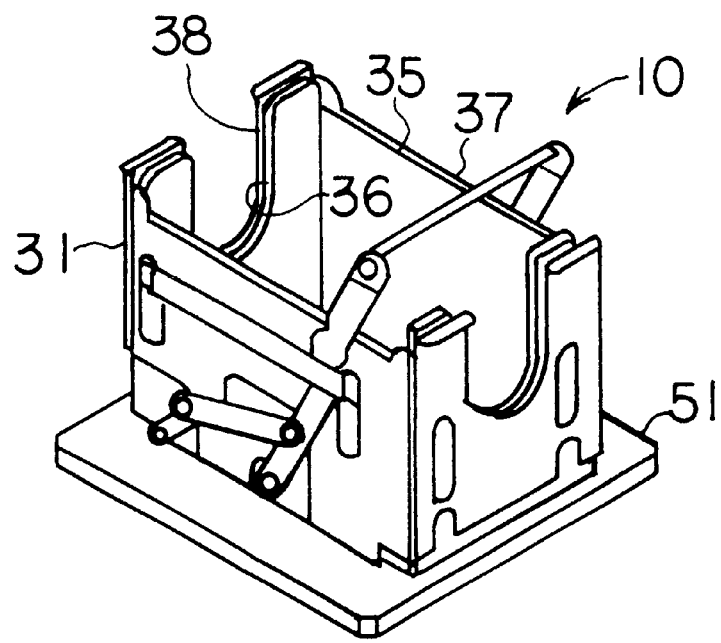
FIG. 10 is a perspective view illustrating the process of fix the jig to the ZIF connector.
Figure 11:
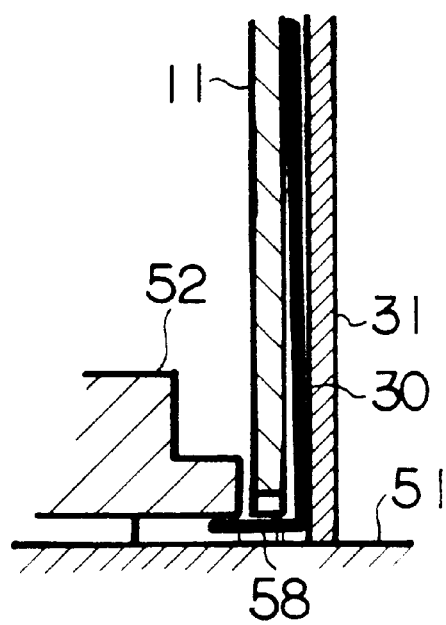
FIG. 11 is an enlarged sectional view, corresponding to FIG. 9, illustrating the leaf spring suffering from the urging force from a slider member.

After the engagement of the swinging levers 17 with the rotative cam 55 has been confirmed, as shown in FIG. 10, an operator is expected to bring the slider member 31 to the lower limit position. The slider member 31 serves to urge the respective leaf springs 30, warping outward without any applied forces, in a direction to allow the free ends to approach the frame 11, as shown in FIG. 11. Deformation is correspondingly induced in the leaf springs 30. The leaf springs 30 are superposed on the frame 11. The hooks 58 at the free ends of the leaf springs 30 are thus allowed to enter between the ZIF connector 52 and the upper surface of the printed circuit board 51. The hooks 58 are engaged with the rear surface of the ZIF connector 52 in at least opposite directions. The jig 10 is fixed to the ZIF connector 52 on the printed circuit board 51 in this manner. As shown in FIG. 10, when the slider member 31 reaches its lower limit position, the edges defined by the first and second recesses 35, 36 on the frame 11 are aligned with the edges defined by the third and fourth recesses 37, 38 on the slider member 31.

Figure 12:
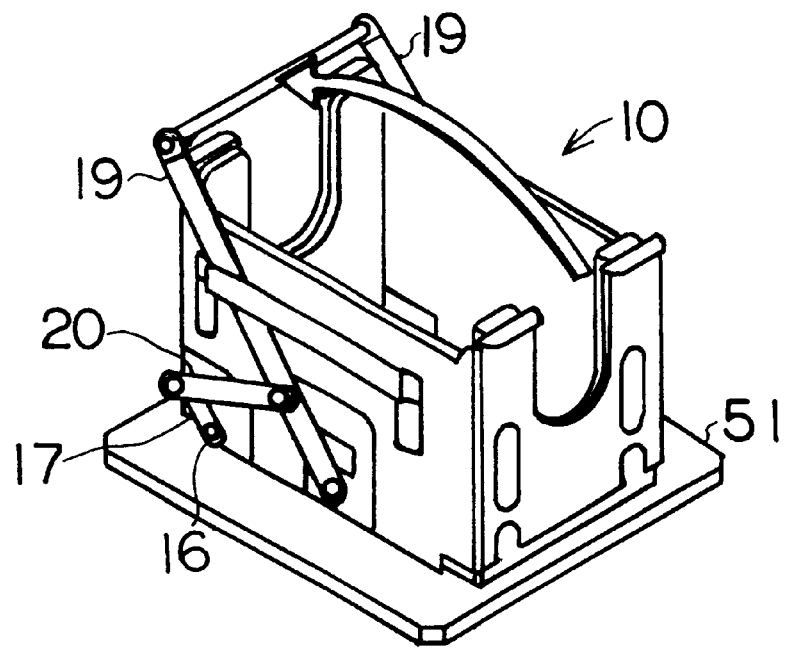
FIG. 12 is a perspective view illustrating the process of opening the sockets of the ZIF connector.

Thereafter, the operator is allowed to swing the operating levers 19 from the first attitude to the second attitude, as shown in FIG. 12. Swinging movement of the operating levers 19 is transformed to swinging movement of the swinging levers 17 with assistance of the link members 20. The rotative axles 16, engaged with the rotative cam 55, are correspondingly driven to rotate around the central axis 15, as shown in FIG. 2B. The rotative cam 55 also rotates along with the rotative axles 16, as shown in FIG. 7. The sockets of the ZIF connector 52 are accordingly wide opened. The ZIF connector 52 is prepared to receive the input/output pins of the MCM.

Figure 13:
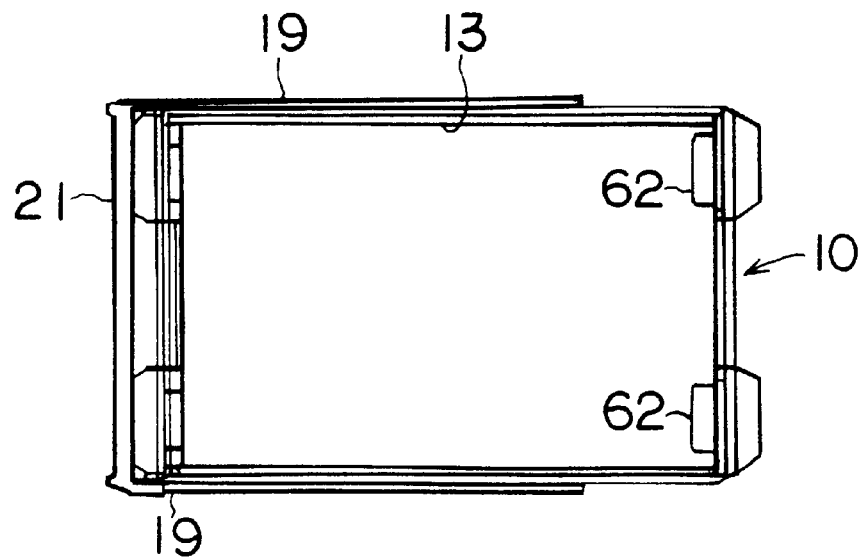
FIG. 13 is a plan view of the jig illustrating the position of a grip when the operating lever takes the second attitude.
Figure 14:
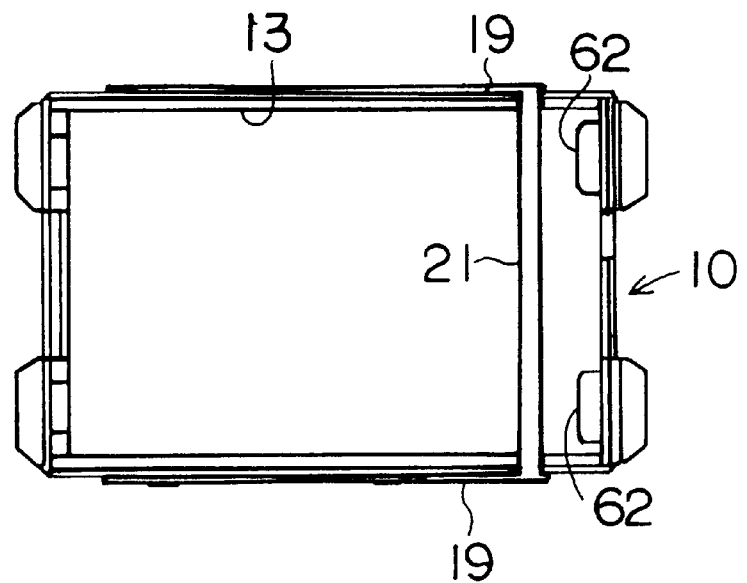
FIG. 14 is a plan view of the jig illustrating the position of the grip when the operating lever takes the first attitude.

When the second attitude is established in the operating levers 19, the grip 21 is held at a position off the insertion opening 13, as is apparent from FIG. 13. The jig 10 is prepared for receiving an MCM inside. On the other hand, when the first attitude is established in the operating levers 19, as shown in FIG. 14, the grip 21 is positioned to extend across the insertion opening 13. An MCM is hindered from entering the insertion opening 13 leading to the guide passage 14. The first attitude of the operating levers 19 represents the closed sockets of the ZIF connector 52. Accordingly, the grip 21 serves to avoid erroneous insertion of an MCM into the jig 10 when the sockets of the ZIF connector 52 are closed. It is possible to reliably avoid the input/output pins of an MCM from damaging.

Figure 15:
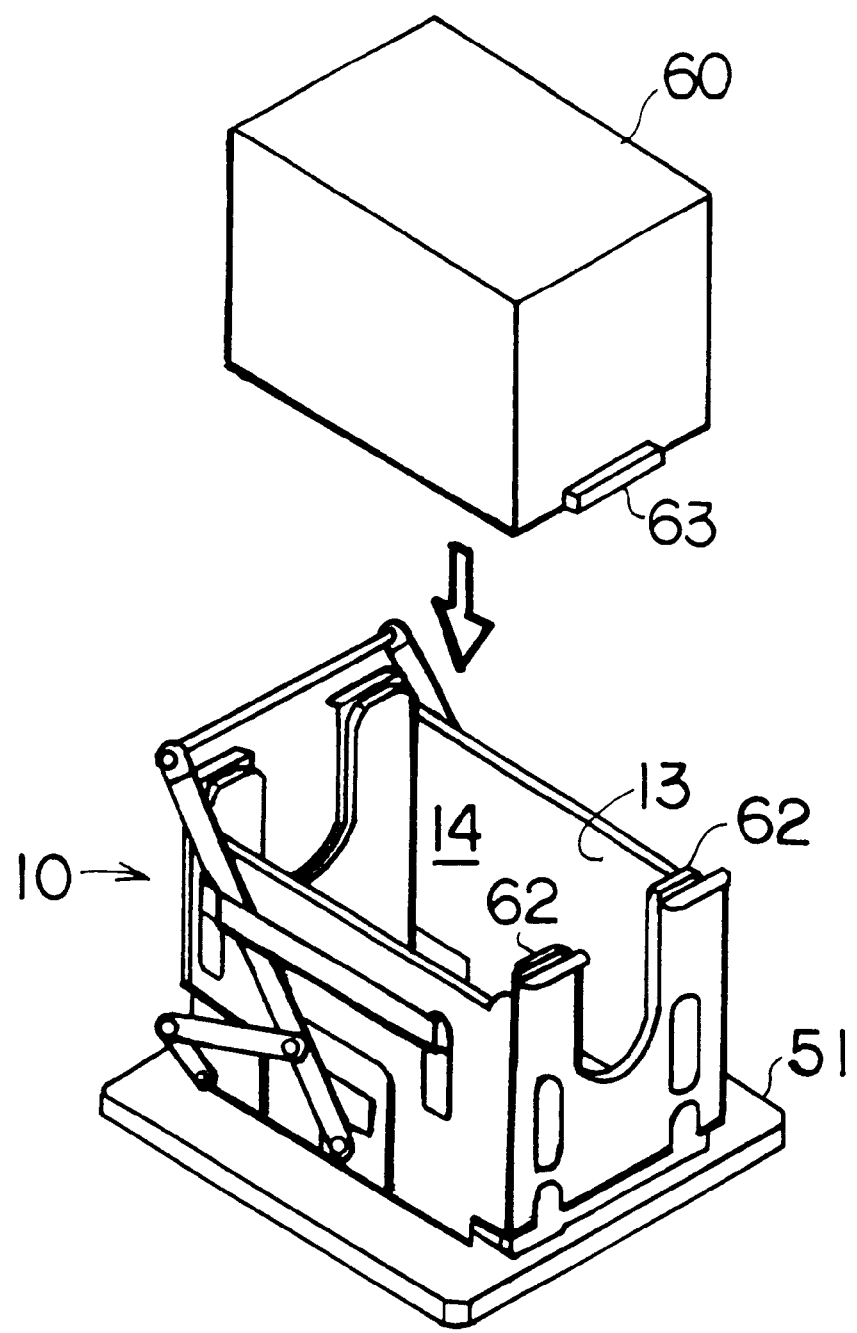
FIG. 15 is a perspective view illustrating the process of inserting the MCM into the jig.

When the jig 10 has been completely prepared for receiving an MCM in the above-described manner, the operator is expected to insert the MCM 60 into the jig 10 through the insertion opening 13, as shown in FIG. 15. The MCM 60 is guided along the guide passage 14 from the insertion opening 13 to the connector receptacle opening 12. When the MCM 60 is seated on the upper surface of the ZIF connector 52, the input/output pins of the MCM 60 are smoothly inserted into the corresponding sockets of the ZIF connector 52.

The position of the MCM 60 in the frame 11 of the jig 10 is determined to reflect the alignment between the input/output pins of the MCM 60 and the corresponding sockets defined in the ZIF connector 52. The frame 11 is thus employed to simply guide the MCM 60 so that the input/output pins of the MCM 60 are reliably received in the corresponding sockets in the ZIF connector 52 without any interference. The input/output pins of the MCM 60 can be avoided from damaging due to collision against the entrances of the sockets.

In particular, maintenance of a computer system often requires attachment of the MCM 60 to the printed circuit board 51 without disassembling the printed circuit board 51 from the computer system. Even when the ZIF connector 52 is closely surrounded by other printed circuit boards and electronic components, the jig 10 according to the present embodiment serves to reliably allow the input/output pins of the MCM 60 to enter the corresponding sockets of the ZIF connector 52 without damage due to collision of the input/output pins. In this case, it is surely enough to simply fix the jig 10 to the surface of the printed circuit board 51. The operator is released from troublesome positioning of the MCM 60 based on observation with his own eyes.

Figure 16:
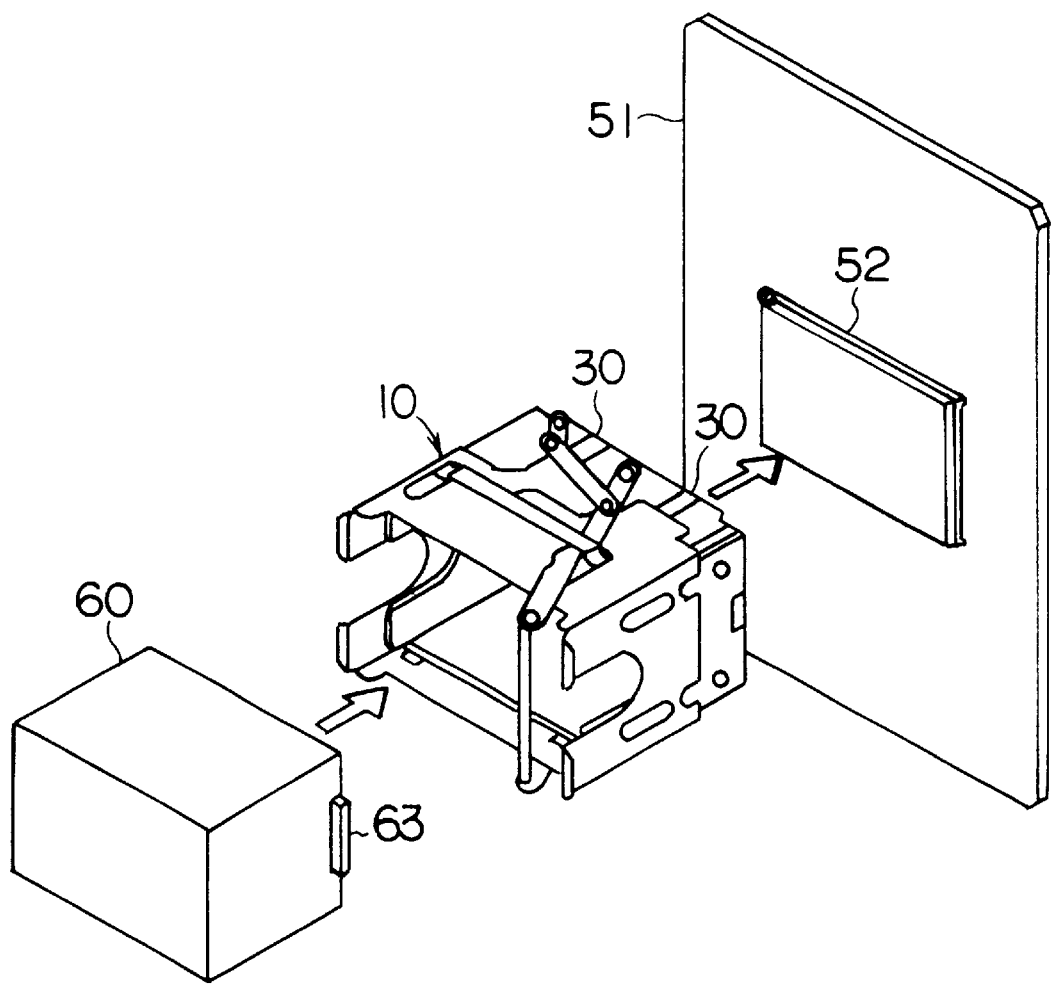
FIG. 16 is a perspective view illustrating the process of inserting the MCM into the jig when the printed circuit board takes a vertical attitude.

In addition, the MCM 60 is sometimes to be mounted on the upright printed circuit board 51 during maintenance, as shown in FIG. 16, for example. Since the jig 10 according to the present embodiment is designed to employ a fixation mechanism comprising the leaf springs 30 and the hooks 58 as described above, the operator need not keep urging the jig 10 against the surface of the printed circuit board 51 during an overall period of maintenance. The hooks 58 serve to hold the jig 10 against the upright printed circuit board 51.

As shown in FIG. 15, when the MCM 60 is inserted into the jig 10, a pair of restriction rails 62 are designed to restrict the attitude or aspect of the MCM 60. The restriction rails 62 extend on the inner surface of the frame 11 in a vertical direction along the guide passage 14. The restriction rails 62 protrude, as is apparent from FIGS. 13 and 14, into the guide passage 14 so as to define a groove therebetween for receiving a protrusion 63 integrally formed on the outer surface of the MCM 60. If the MCM 60 is intended to enter the insertion opening 13 in an attitude or aspect different from the predetermined one, the protrusion 63 is adapted to collide with the edge of the insertion opening 13. The MCM 60 is thus prevented from entering into the guide passage 14. Such adjustment of the attitude or aspect of the MCM 60 is expected to prevent not only the ZIF connector 52 from receiving the MCM 60 in an incorrect attitude or aspect but also the input/output pins of the MCM 60 from erroneously colliding against the entrances of the sockets defined in the ZIF connector 52.

Figure 17:
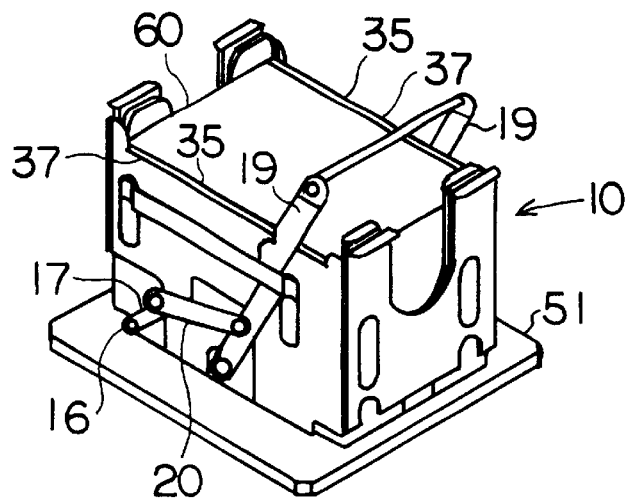
FIG. 17 is a perspective view illustrating the process of closing the sockets of the ZIF connector.

A thumb and fingers, grasping the MCM 60, of the operator can be received in the second and fourth recesses 36, 38 during insertion of the MCM 60 until it is completely set on the surface of the ZIF connector 52. When the MCM 60 has completely been set on the ZIF connector 52, the operator is allowed to swing the operating levers 19 to the first attitude from the second attitude, as shown in FIG. 17.

At this moment, the first and third recesses 35, 37 may be employed to observe completion of the insertion, if the upper edges of the first and third recesses 35, 37 are designed to define a plane aligned with the upper edges or surface of the MCM 60 which has completely been set on the ZIF connector 52. As shown in FIG. 17, the operator is allowed to observe whether or not the MCM 60 is completely mounted on the ZIF connector 52 based on alignment of the edges of the first and third recesses 35, 37 with the upper edges or surface of the MCM 60.

The swinging movement of the operating levers 19 reverting to the first attitude is transformed to the swinging movement of the swinging levers 17 with assistance of the link members 20. The rotative axles 16, engaged with the rotative cam 55, are correspondingly driven to rotate around the central axis 15, as shown in FIG. 2B, in the reverse direction. The cam receptacle grooves 41 return to the vertical attitude, as shown in FIG. 2A. The engagement pieces 57 of the rotative cam 55 are thus allowed to revert to the vertical attitude, as shown in FIG. 6. The sockets of the ZIF connector 52 are correspondingly fully closed, so that the input/output pins of the MCM 60 are tightly held within the sockets.

Figure 18:
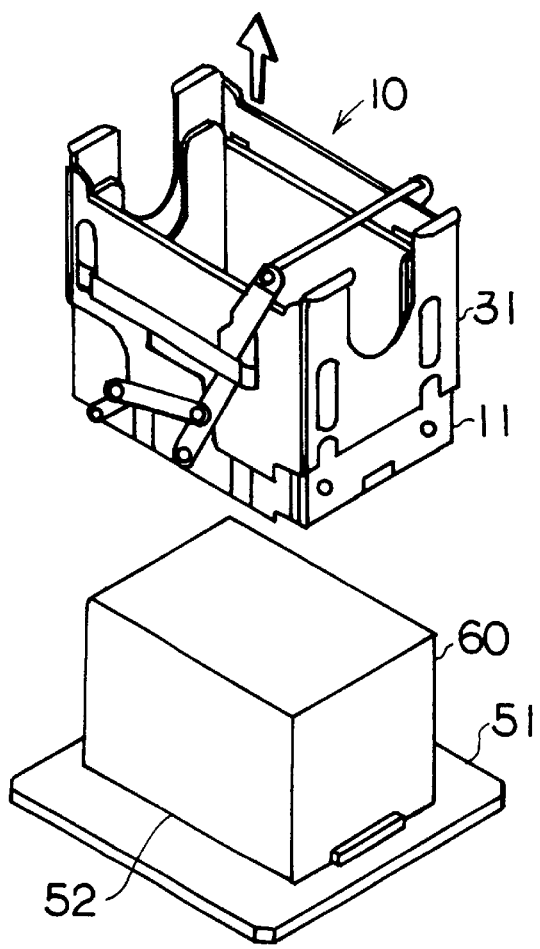
FIG. 18 is a perspective view illustrating the process of removing the jig from the ZIF connector.

Thereafter, the slider member 31 is lifted to the upper limit position. The respective leaf springs 30 are released from the urging force of the slider member 31, as shown in FIG. 9, so that the hooks 58 at the free ends of leaf springs 30 are allowed to retract out of the guide passage 14 or connector receptacle opening 12. The engagement of the hooks 58 is released. The jig 10 can consequently be removed from the ZIF connector 52 on the printed circuit board 51, as shown in FIG. 18. The MCM 60 is held on the ZIF connector 52 even after the jig 10 has been detached. Attachment of the MCM 60 on the ZIF connector 52 has been completed.

Figure 19:
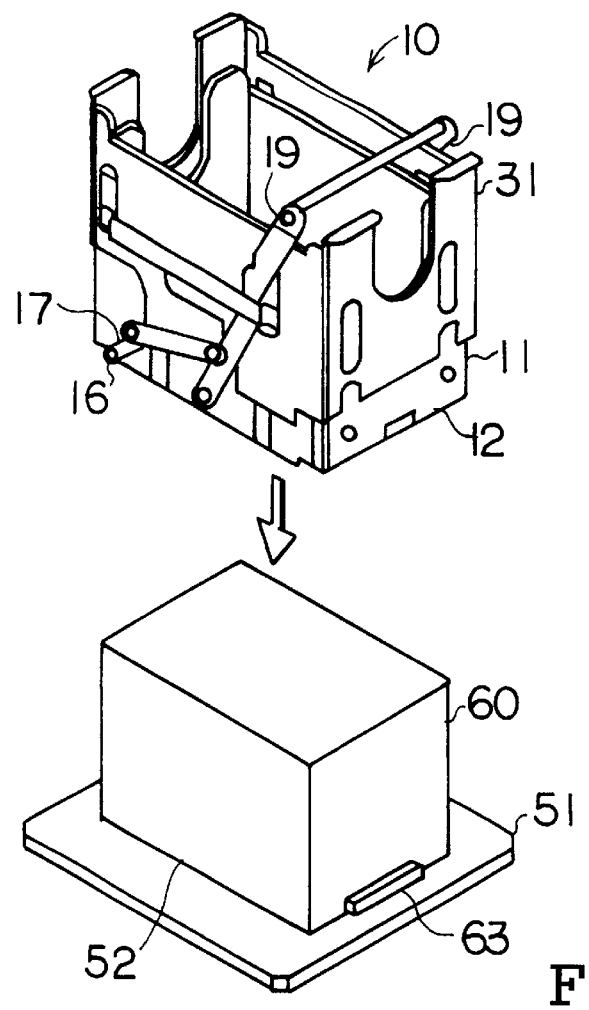
FIG. 19 is a perspective view illustrating the process of setting the jig on the printed circuit board when the MCM is to be detached from the ZIF connector.

On the contrary, when the MCM 60 is to be detached from the ZIF connector 52 on the printed circuit board 51, an operator is expected to set the jig 10 on the printed circuit board 51, as shown in FIG. 19. The MCM 60 and the ZIF connector 52 are simultaneously received in the connector receptacle opening 12. When the jig 10 has been set in this manner, the frame 11 is allowed to stand upright on the surface of the printed circuit board 51 surrounding the ZIF connector 52.

During setting of the jig 10 on the printed circuit board 51, the slider member 31 is maintained at the upper limit position. Accordingly, the MCM 60 and the ZIF connector 52 can be received in the connector receptacle opening 12 without any interference of the hooks 58, in the aforementioned manner. At the same time, the operating levers 19, kept in the first attitude, relatively easily allow establishment of engagement between the rotative axles 16, namely, the swinging levers 17 and the rotative cam 55 without any difficulty, in the aforementioned manner.

If the jig 10 is intended to set around the MCM 60 in an attitude or aspect different from the predetermined one, the restriction rails 62 in the guide passage 14 serve to offset or shift the jig 10 out of a proper position. Before the jig 10 is finally set on the printed circuit board 51, the connector receptacle opening 12 collides against the protrusion 63 formed on the MCM 60, so that the lower end of the jig 10 cannot completely reach the surface of the printed circuit board 51.

Figure 20:
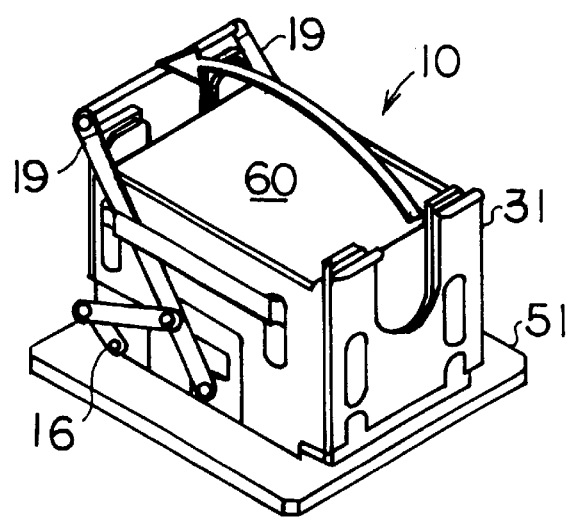
FIG. 20 is a perspective view illustrating the process of opening the sockets of the ZIF connector.
Figure 21:
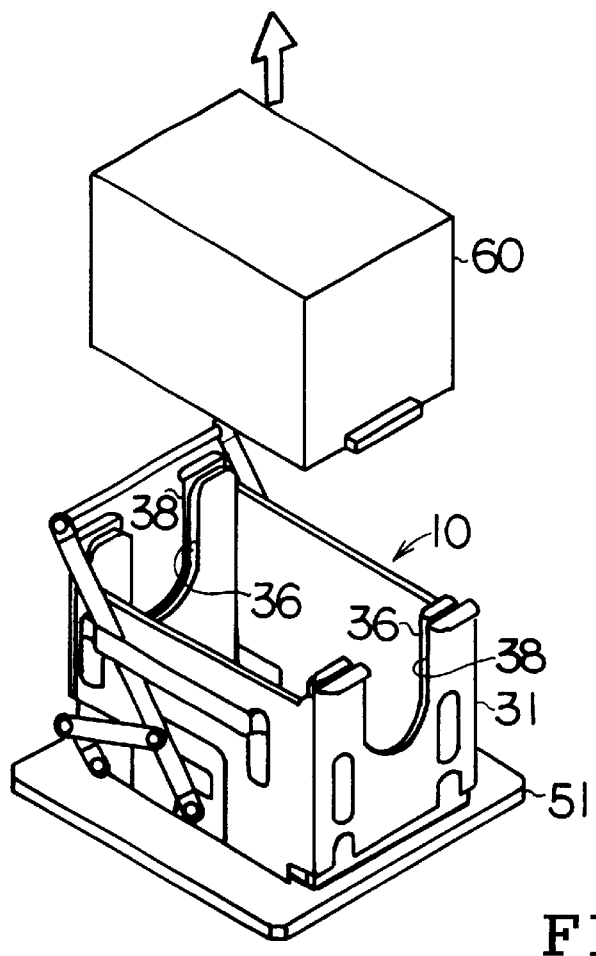
FIG. 21 is a perspective view illustrating the process of removing the MCM from the ZIF connector.

When the engagement between the rotative cam 55 and the swinging levers 17 has been confirmed, as shown in FIG. 20, the operator is expected to bring the slider member 31 to the lower limit position. The jig 10 is thus fixed to the ZIF connector 52 on the printed circuit board 51, in the aforementioned manner. The operator is thereafter allowed to swing the operating levers 19 from the first attitude to the second attitude. The rotative axles 16 engaged with the rotative cam 55 are correspondingly driven to rotate around the central axis 15. The sockets of the ZIF connector 52 are accordingly wide opened. The input/output pins of the MCM 60 are released from restraint of the sockets. The MCM 60 can be detached from the ZIF connector 52, as shown in FIG. 21. The operator may simply grasp the MCM 60 with his own thumb and fingers through the second and fourth recesses 36, 38 so as to pull out the MCM 60 from the jig 10.

Figure 22:
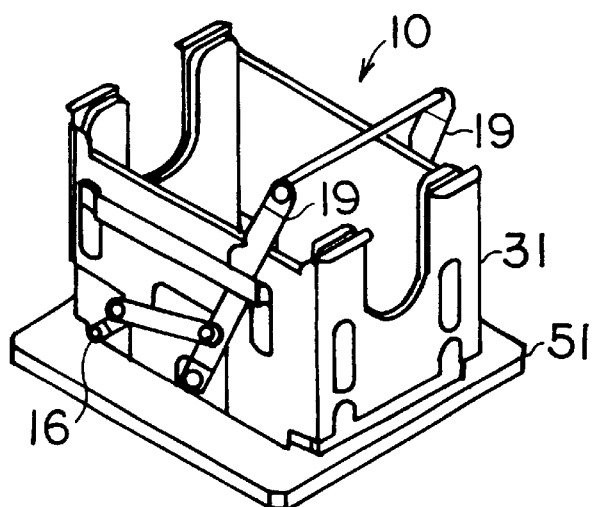
FIG. 22 is a perspective view illustrating the process of closing the sockets of the ZIF connector.

Subsequently, the operator is allowed to swing the operating levers 19 to the first attitude from the second attitude, as shown in FIG. 22. When the first attitude has been established in the operating levers 19, the rotative axles 16 engaged with the rotative cam 55 are correspondingly driven to rotate around the central axis 15, as shown in FIG. 2B, in the reverse direction. The cam receptacle grooves 41 return to the vertical attitude, as shown in FIG. 2A. The engagement pieces 57 of the rotative cam 55 are thus allowed to revert to the vertical attitude, as shown in FIG. 6. The sockets of the ZIF connector 52 are correspondingly fully closed, so that the ZIF connector 52 is prepared for the subsequent attachment of an MCM.

When the slider member 31 is finally lifted to the upper limit position, the respective leaf springs 30 are released from the urging force of the slider member 31, as shown in FIG. 9. The hooks 58 at the free ends of the leaf springs 30 are allowed to retract out of the guide passage 14 or connector receptacle opening 12. The jig 10 can accordingly be removed from the ZIF connector 52 on the printed circuit board 51. Detachment of the MCM 60 has been completed after the jig 10 is removed from the ZIF connector 52 in the above-described manner.

The distance d1 between the support axis 18 and the first connecting pin 23 on the operating lever 19 is set larger than the distance d2 between the central axis 15 and the second connecting pin 24 on the swinging lever 17 in the jig 10 according to the present embodiment, so that the swinging movement of the operating levers 19 can be transformed to the amplified swinging movement of the swinging levers 17. A less extent of the swinging movement is only required for the operating levers 19 so as to induce rotation of the rotative cam 55 required to achieve full opening and closing operation of the sockets of the ZIF connector 52. Such an extent of the swinging movement serves to prevent the tip ends of the operating levers 19 and the grip 21 from projecting outward of the frame 11. Even when other printed circuit board and/or electronic components are disposed to closely surround the ZIF connector 52, attachment and detachment of the MCM 60 can reliably be achieved without any interference in such a crowded circumstance.

In addition, the extent of the operating levers 19 is reliably defined by the first restriction piece 26, which is fixed to the frame 11 at a position to contact the operating lever 19 when the sockets are all closed, in combination with the second restriction piece 27, which is likewise fixed to the frame 11 at a position to contact the operating lever 19 when the sockets are fully opened. Accordingly, the rotative cam 55 of the ZIF connector 52 can be prevented from an excessive rotation beyond the extent required to fully open and close the sockets of the ZIF connector 52. The ZIF connector 52 can be prevented from damages due to any excessive rotation of the rotative cam 55.

Figure 23:
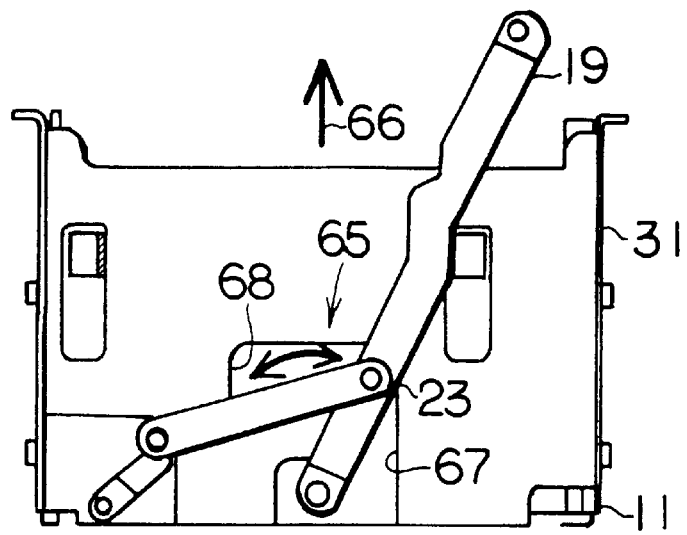
FIG. 23 is a side view of the jig schematically illustrating a guide opening f or establishing a self-protection mechanism according to the present invention.

In addition to the above-described fundamental structures, the jig 10 according to the present embodiment comprises a self-protection mechanism for preventing erroneous operation or manipulation of an operator. The self-protection mechanism can be realized, as shown in FIG. 23, for example, a combination of the first connecting pins 23 interposed between the operating levers 19 and the link members 20, respectively, and a pair of guide openings 65 formed in the slider member 31 so as to receive the corresponding first connecting pins 23, respectively. One of the pair is illustrated in FIG. 23.

Specifically, the guide opening 65 comprises a first guide passage 67 extending in a vertical direction 66, namely, the direction along the movement of the slider member 31, and a second guide passage 68 extending from the upper end of the first guide passage 67 in a horizontal direction perpendicular to the direction of the movement of the slider member 31. The first guide passage 67 is designed to have a longitudinal or vertical dimension enough to allow the first connecting pin 23 to move along without any interference even when the slider member 31 is moved between the upper and lower limit positions, as is apparent from FIGS. 23 and 24. On the other hand, the second guide passage 68 is designed to have a longitudinal or horizontal dimension enough to allow the first connecting pin 23 to move without any interference even when the operating lever 19 swings between the first and second attitudes, as is also apparent from FIG. 23.

Figure 24:
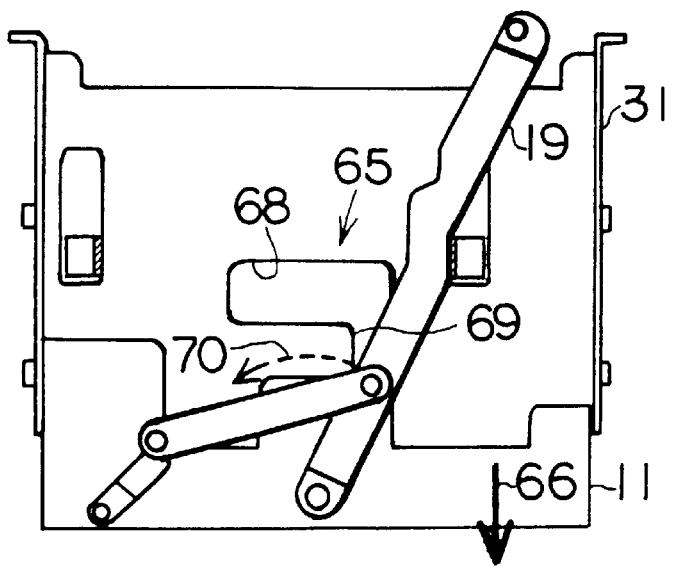
FIG. 24 is a side view of the jig illustrating the function of the guide opening when the slider member is set at the upper limit position.

When the slider member 31 is lifted to the upper limit position, as shown in FIG. 24, allowing the aforementioned hooks 58 to retract out of the connector receptacle opening 12, for example, a stopper 69 defined at the edge of the guide opening 65 is allowed to extend right across the path of the operating lever 19, namely, a partial circular path 70 of the first connecting pin 23. If the operating lever 19 is intended to swing from the first attitude to the second attitude in this situation, the first connecting pin 23 is caused to collide against the stopper 69, so that the first connecting pin 23 is restrained from movement, in other words, the operating lever 19 is restrained from swinging.

Consequently, the stopper 69 is adapted to reliably prevent the operating levers 19 from swinging out of the first attitude, thereby avoiding the sockets from opening, when the jig 10 is not coupled with the ZIF connector 52. The jig 10 is prevented from erroneously dropping from the ZIF connector 52 on the printed circuit board 51 during the operation of attachment and detachment of the MCM 60.

Figure 25:
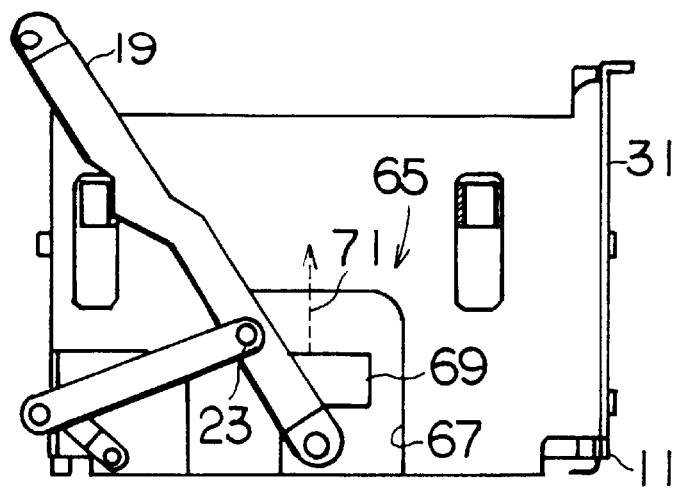
FIG. 25 is a side view of the jig illustrating the function of the guide opening when the operating lever takes the second attitude.

In addition, when the second attitude is established in the operating lever 19 so as to fully open the sockets of the ZIF connector 52, for example, the first connecting pin 23 on the operating lever 19 is positioned right on the path of the moving slider member 31, namely, the linear path 71 of the stopper 69, as shown in FIG. 25. If the slider member 31 is intended to rise from the lower limit position to the upper limit position in this situation, the stopper 69 is caused to collide against the first connecting pin 23 on the operating leer 19, so that the stopper 69 is restrained from movement, in other words, the slider member 31 is restrained from rising. The slider member 31 cannot serve to release engagement of the hooks 58 at the free ends of the leaf springs 30 with the ZIF connector 52.

Figure 26:
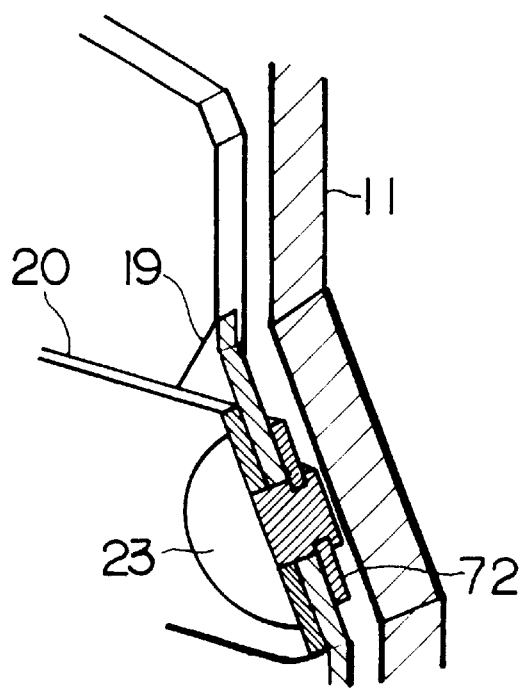
FIG. 26 is an enlarged partial sectional view illustrating the detailed structure of a first connecting pin.

Consequently, the stopper 69 in combination with the first connecting pin 23 is adapted to reliably prevent removal of the jig 10 from the ZIF connector 52 when the sockets of the ZIF connector 52 are still opened. The sockets are thus adapted to keep closed after the jig 10 has been removed from the ZIF connector 52. An e-shaped or c-shaped ring 72, as shown in FIG. 26, may be engaged on the first connecting pin 23 protruding toward the frame 11 when the aforementioned guide opening 65 is employed in the jig 10. It should be noted that the first connecting pin 23 functions as a drop prevention member according to the present invention.

What is claimed is:

1. A jig for attachment and detachment of an electronic component, comprising:
   a frame;
   a connector receptacle opening defined in the frame so as to have dimensions enough to surround a connector mounted on a printed circuit board;
   an insertion opening defined in the frame so as to have dimensions enough to surround an electronic component with an input/output pin received in the connector;
   a guide passage defined in the frame so as to extend from the insertion opening to the connector receptacle opening; and
   a swinging lever supported on the frame so as to engage with a rotative cam for opening and closing a socket of the connector.

2. The jig according to claim 1, further comprising a fixation mechanism adapted to fix the frame to the printed circuit board.

3. The jig according to claim 2, further comprising:
   an operating lever supported on the frame for swinging movement around a support axis;
   a link member connecting the operating layer to the swinging lever; and
   a stopper adapted to extend across a path of movement of the operating lever when the fixation mechanism fails to fix the frame to the printed circuit board.

4. The jig according to claim 2, where in the fixation mechanism comprises:
   a leaf spring attached to the frame so as to keep a free end thereof apart from the frame;
   a hook formed at the free end of the leaf spring so as to keep retracted out of the connector receptacle opening when no load is applied to the leaf spring; and
   a slider member guided along an outer periphery of the frame so as to apply an urging force to the leaf spring for bringing the hook into engagement with the connector in response to deformation of the leaf spring.

5. The jig according to claim 4, further comprising:
   an operating lever supported on the frame for swinging movement around a support axis;
   a link member connecting the operating lever to the swinging lever; and
   a stopper adapted to extend across a path of movement of the operating lever when the slider member fails to establish the urging force to the leaf spring.

6. The jig according to claim 5, further comprising a drop prevention member adapted to be located on a path of movement of the slider member when the socket is opened.

7. The jig according to claim 1, further comprising:
   an operating lever supported on the frame for swinging movement around a support axis; and
   a link member connected to the operating lever at a first connecting axis for swinging movement and to the swinging lever at a second connecting axis for swinging movement, wherein
a distance between the support axis and the first connecting axis is set larger than a distance between a center of swinging movement of the swinging lever and the second connecting axis.

8. The jig according to claim 7, further comprising a restriction member located on the frame at a position to collide with the operating lever when the socket of the connector is closed.

9. The jig according to claim 7, further comprising a restriction member located on the frame at a position to collide with the operating lever when the socket of the connector is opened.

10. The jig according to claim 1, further comprising:
an operating lever supported on the frame for swinging movement around a support axis;
a link member connecting the operating lever to the swinging lever; and
a grip attached to the operating lever so as to extend across the insertion opening when the socket is closed.

11. The jig according to claim 1, further comprising an observation window defined by an edge aligned with an upper edge of the electronic component when the electronic component has been completely set on the connector.

* * * * *